United States Patent [19]
Clementi et al.

[11] Patent Number: 6,004,847
[45] Date of Patent: Dec. 21, 1999

[54] PROCESS FOR FORMING AN INTEGRATED CIRCUIT COMPRISING NON-VOLATILE MEMORY CELLS AND SIDE TRANSISTORS AND CORRESPONDING IC

[75] Inventors: Cesare Clementi, Busto Arsizio; Gabriella Ghidini, Milan; Carlo Riva, Renate Brianza, all of Italy

[73] Assignee: SGS-Thomson Microelectronics S.r.l., Agrate Brianza, Italy

[21] Appl. No.: 08/667,097

[22] Filed: Jun. 20, 1996

[30]     Foreign Application Priority Data

Jun. 30, 1995  [EP]  European Pat. Off. .............. 95830281

[51] Int. Cl.[6] ................................................ H01L 21/8247
[52] U.S. Cl. ........................... 438/258; 438/201; 438/261
[58] Field of Search ................................... 438/257, 258, 438/261, 201

[56]         References Cited

U.S. PATENT DOCUMENTS

| | | | |
|---|---|---|---|
| 4,471,373 | 9/1984 | Shimizu et al. | 357/41 |
| 4,780,424 | 10/1988 | Holler et al. | 437/29 |
| 5,104,819 | 4/1992 | Freiberger et al. | 437/43 |
| 5,449,629 | 9/1995 | Kajita | 438/258 |
| 5,550,072 | 8/1996 | Cacharelis et al. | 438/258 |
| 5,756,385 | 5/1998 | Yuan et al. | 438/258 |

OTHER PUBLICATIONS

IEEE IEDM Technical Digest 93, 1993 pp. 321–324, Hsing–Huang Tsend et al., "Thin CVD Stacked Gate Dielectric For ULSI Technology".

*Primary Examiner*—Richard Booth
*Attorney, Agent, or Firm*—Wolf, Greenfield & Sacks, P.C.

[57]            ABSTRACT

A process for forming an integrated circuit includes at least one matrix of non-volatile memory cells having an intermediate dielectric multilayer including at least a lower dielectric material layer and an upper silicon oxide layer. The integrated circuit includes at least one transistor simultaneously formed in zones peripheral to the matrix and having a gate dielectric of a first thickness. After formation of the floating gate with a gate oxide layer and a polycrystalline silicon layer and the formation of the lower dielectric material layer, the process includes removal of said layers from the peripheral zones of the matrix; deposition of said upper silicon oxide layer over the memory cells, and over the substrate in the areas of the peripheral transistors; and formation of a first silicon oxide layer at least in the areas of the peripheral transistors. A second transistor type can be formed having a gate dielectric of a second thickness, thinner than said first thickness, in successive steps.

14 Claims, 3 Drawing Sheets

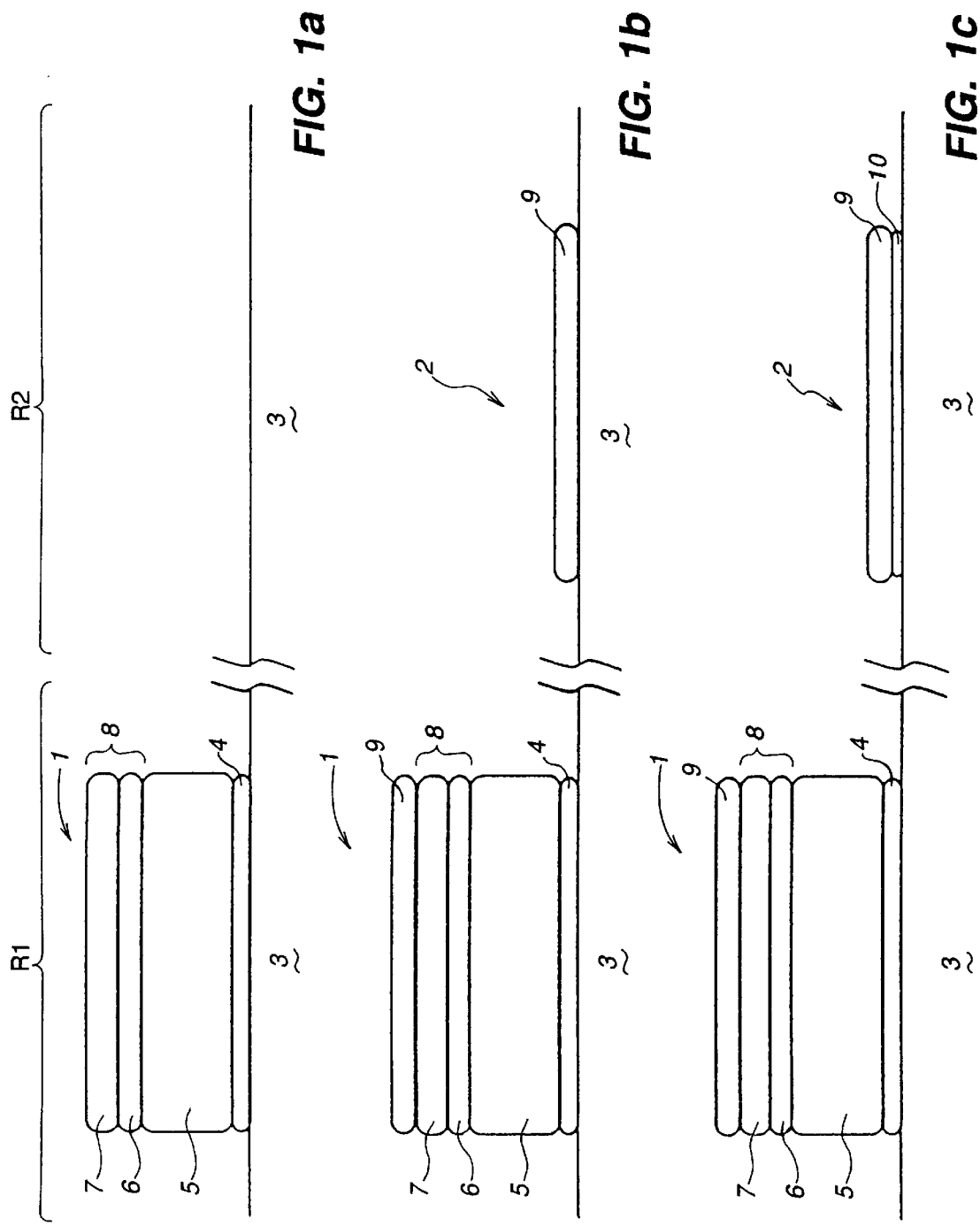

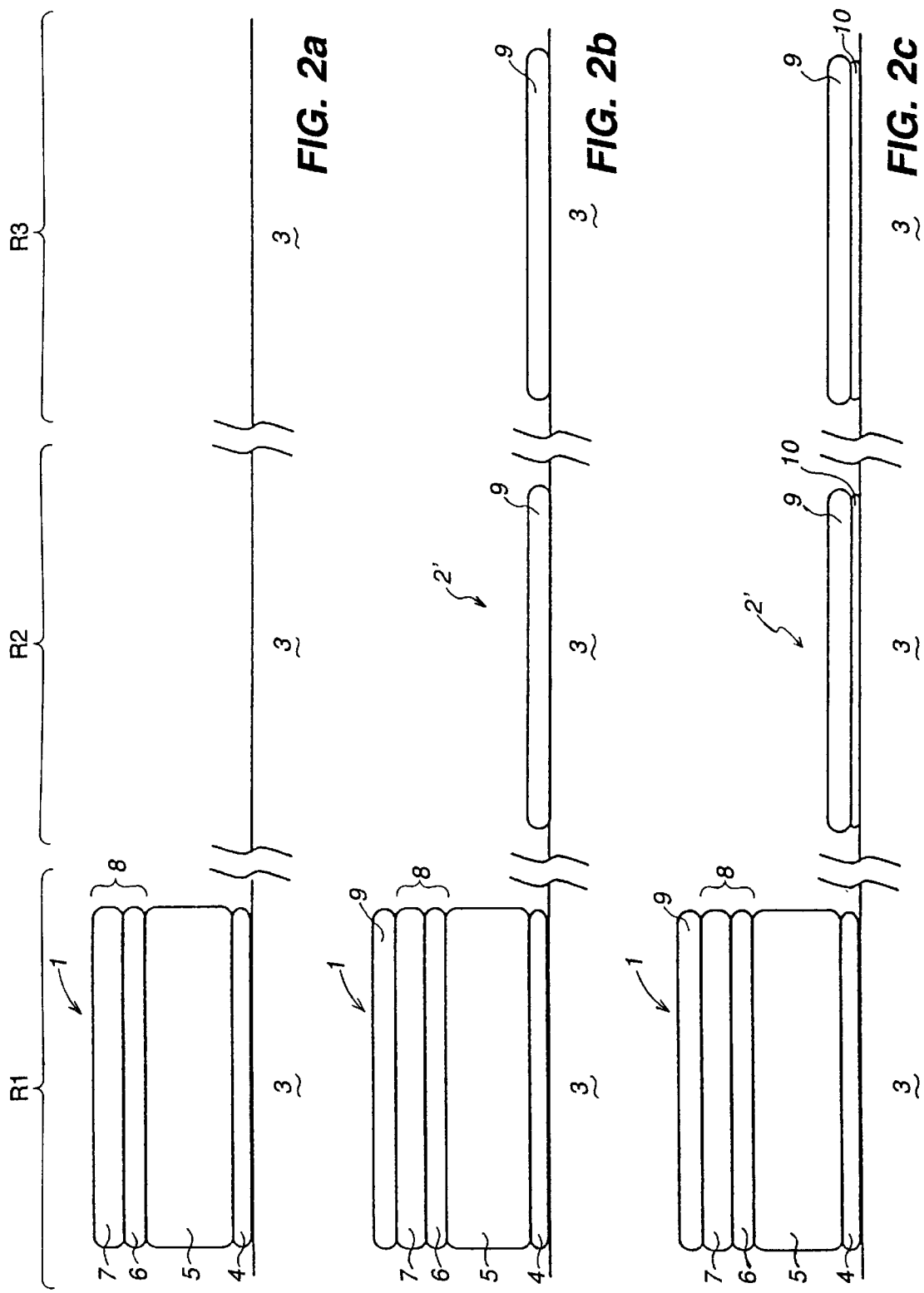

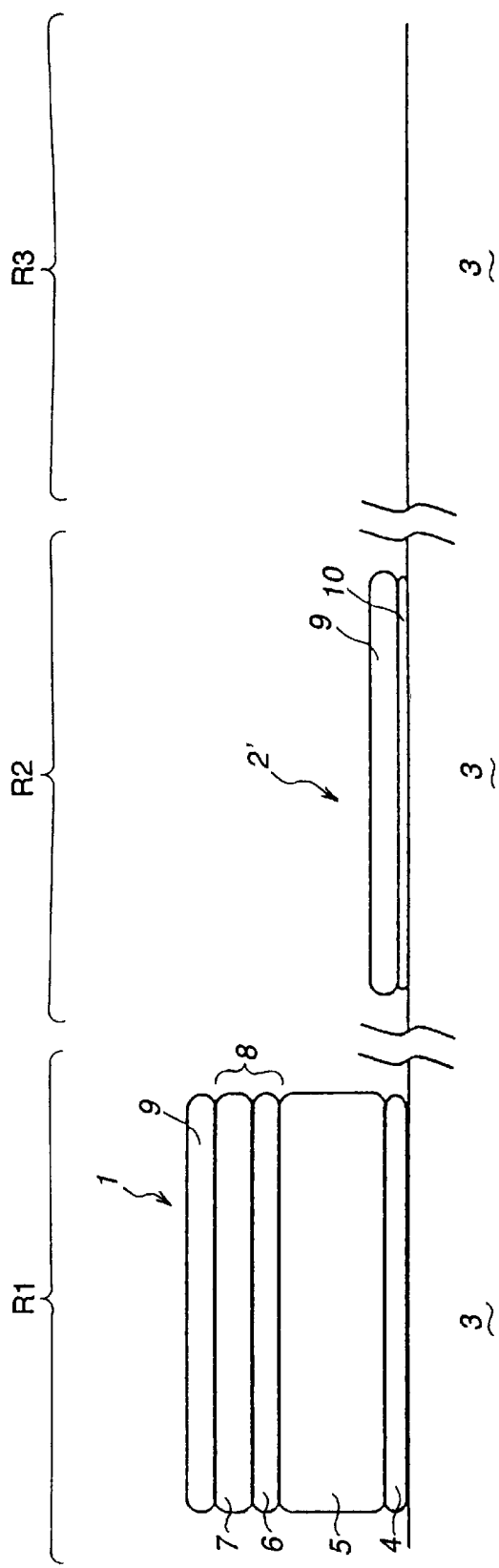
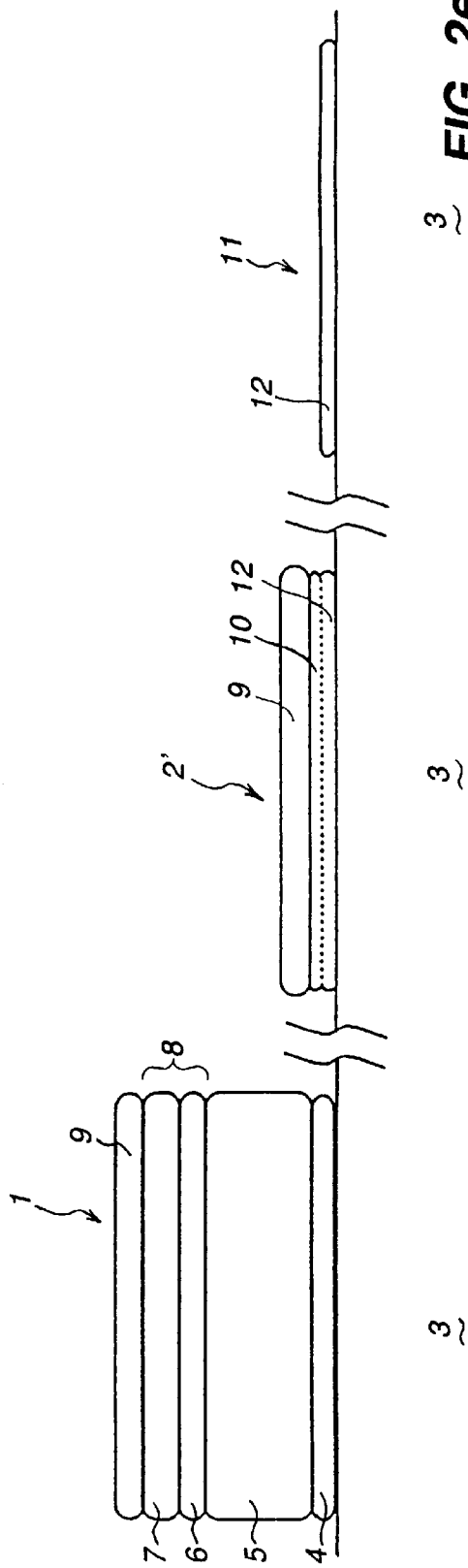

PROCESS FOR FORMING AN INTEGRATED CIRCUIT COMPRISING NON-VOLATILE MEMORY CELLS AND SIDE TRANSISTORS AND CORRESPONDING IC

BACKGROUND OF THE INVENTION

1. Field of the Invention

The present invention relates to a process for forming an integrated circuit comprising non-volatile memory cells and peripheral transistors.

Specifically, the present invention relates to a process providing for the implementation in a monocrystalline silicon substrate of at least one matrix of memory cells. In each memory cell, a floating gate and a control gate, both electroconductive, are mutually electrically insulated by means of an intermediate dielectric multilayer. There is also provided simultaneous formation, peripheral to the matrix zones, of at least one first type of MOS transistor.

The present invention also relates to an integrated circuit of the above mentioned type comprising non-volatile memory cells having an intermediate dielectric multilayer and at least one type of peripheral transistors.

2. Discussion of the Related Art

As is known in the field of electronic semiconductor technology, in order to reduce the area of integrated circuits there is a tendency towards ever greater integration scales with a reduction of component sizes. This has led to improvement of the quality of the materials used and to optimization of the processes for their formation.

The present invention relates to the field of the development of the techniques of formation of dielectric materials in a single integrated circuit, and in the formation of layers of different thickness and composition which perform different functions. On one hand the dielectric materials act as insulators providing electrical insulation of conductive layers and creating a barrier against contaminating substances coming from the outside ambient, while on the other hand the dielectric materials as active dielectrics allowing the passage of charges between layers of conductive materials.

In order to improve the quality and functionality of the above mentioned dielectrics it has been proposed in relatively recent times to provide multiple superimposed layers, in particular using layers of silicon oxides and/or silicon nitrides.

In the specific field of application of the present invention there are provided integrated memory circuits including, in addition to a plurality of memory cells arranged in one or more matrixes, external or peripheral circuits in which components are structurally similar to the cells and are provided by the same technology. Specific reference is made to MOS transistors.

Non-volatile memories, to which specific reference is made in the present invention, comprise different classes of devices or products which differ from each other by the structure of the individual memory cell and the type of application. Specifically reference is made to read-only memories which can be electrically programmed and erased (Erasable Programmable Read Only Memories) and specifically EPROM, EEPROM or FLASH. These types of memories can be distinguished from one another as some of them are both erasable and electrically programmable, while others require, e.g., ultraviolet light to be erased. For data storage, memory cells comprise in all cases a floating-gate MOS transistor integrated on a substrate usually of monocrystalline silicon. The amount of charge contained in the floating gate determines the logical state of the cell. Non-volatile memory cells are programmed in a discrete number of logical states allowing memorization of one or more bits per cell. In standard cells, for exarnple, programming is provided in two logical states, written and erased, with memorization of one bit per cell.

The floating gate of electroconductive material, normally polysilicon, i.e., polycrystalline silicon or 'poly', is completely surrounded by insulating material. In particular, over the floating gate a dielectric layer, so-called intermediate dielectric or interpoly, insulates the floating gate from an overlying control gate also of electroconductive material. The control gate can consist alternatively of a single polysilicon layer or of a double polysilicon trasversal silicide layer and is coupled electrically to a programming terminal.

As known to those skilled in the art the interpoly dielectric is particularly critical in terms of charge retention. This dielectric can consist of a silicon oxide layer in accordance with well known techniques. Development of the technology has also revealed as advantageous the use of a multilayer intermediate dielectric. This preserves the insulating characteristics of the intermediate layer while avoiding the problem of loss of charge from the floating gate to the control gate, whether over the long term or when a high programming potential is applied to the control gate. In particular, as known to those skilled in the art, this class of intermediate dielectrics comprises a triple layer of silicon oxide, silicon nitride and silicon oxide, the so-called ONO. As described e.g. in U.S. Pat. No. 5,104,819, after formation of an underlying silicon oxide layer and deposition of silicon nitride, an upper silicon oxide layer is formed by deposition instead of by the conventional oxidation of the underlying nitride. This type of dielectric achieved has good charge retention capability and increased capacitive coupling between floating gate and control gate.

Regarding the so-called external or peripheral transistors, they are incorporated in circuits outside the memory cell matrix, e.g., logical, or matrix control circuits. Specifically in the framework of the present invention, reference is made, as indicated above, to MOS transistors.

MOS transistors include an active dielectric, the so-called gate dielectric, placed between the substrate and a gate of electroconductive material, normally polysilicon. Usually the active dielectric consists of a silicon oxide layer formed at a high temperature by oxidation of the substrate.

To minimize the number of production process steps of the entire integrated circuit it is known to make the memory cells and peripheral transistors simultaneously, as mentioned above. Specifically, the present invention falls within a class of processes in which the polysilicon layer making up the gate of the peripheral transistors corresponds to the formation process step in which the control gate polysilicon layer of the memory cells is formed. In these processes the intermediate dielectric of the memory cells and the gate dielectric of the transistors of the circuitry are also formed simultaneously.

A process of the prior art comprises essentially the following steps:

formation of a first polysilicon layer of the floating gate and of the intermediate dielectric after formation of a gate silicon oxide layer of the cells, removal of the above mentioned layers from the zones in which the transistors of the circuitry are formed;

formation, by means of high-temperature substrate oxidation, of a silicon oxide layer in the areas in which the peripheral transistors are to be formed; and formation of a second polysilicon layer of the control gate of the cells and which also constitutes the gate of the peripheral transistors.

If it is necessary to form two peripheral transistor types with different gate oxide thicknesses, before formation of the second polysilicon layer, the prior art process comprises the additional steps of:

removal of the silicon oxide layer from the areas of the additional transistor type; and formation, again by substrate oxidation, of another silicon oxide layer in the areas of both transistor types.

Recently, in the framework of the research for new types of dielectrics using MOS transistors, there was proposed use of a gate dielectric comprising, in addition to a silicon oxide layer achieved by high-temperature thermal oxidation, an overlying layer also of silicon oxide but achieved by deposition. The benefits of such a composite dielectric are described for example in an article entitled "Thin CVD stacked gate dielectric for ULSI technology" by Hsing-Huang Tseng et al, IEDM Technical Digest, pages 321–324, 1993.

In U.S. Pat. No. 5,104,819 mentioned above there is disclosed formation of a memory cell matrix having ONO type interpoly dielectric and peripheral transistors with gate dielectric including another deposited silicon oxide layer. The deposited silicon oxide layer of the intermediate dielectric multilayer of the cells also constitutes the gate dielectric upper layer of the peripheral transistors and is formed successively over a first gate thermal silicon oxide layer.

This manufacturing process however only permits formation of a single type of peripheral transistor. In addition the silicon oxide deposited to complete the gate dielectric is not good quality if its deposition is not followed by a so-called thermodynamic annealing process, as indicated to be necessary in the above mentioned article.

An object of the present invention is to conceive a process for the formation of non-volatile memory cells and peripheral transistors permitting achievement of a gate dielectric and an intermediate dielectric of good quality, in order to achieve an integrated circuit having characteristics of great reliability and functionality.

Another object is to provide this circuit while minimizing the number of process steps and thus the production costs.

Another object is to provide a process which is particularly flexible and usable, for example, in the simultaneous formation of peripheral transistors having different gate dielectrics.

Another object of the present invention is to provide a process usable either with intermediate dielectrics comprising only silicon oxide or consisting of the triple ONO layer.

SUMMARY OF THE INVENTION

In accordance with the present invention a process for the formation of an integrated circuit in a monocrystalline silicon substrate calls for the provision of at least one matrix of non-volatile memory cells, each of which includes a floating gate and a control gate, both being electroconductive. The floating gate and control gate are electrically insulated from each other by means of an intermediate dielectric multilayer including at least one lower dielectric material layer and one upper silicon oxide layer. The process also comprises simultaneous realization in zones peripheral to the matrix of at least a first transistor type having gate dielectric of a first thickness. There is considered in particular a process of the type in which the gate dielectric of the at least a first transistor is formed concomitantly with the intermediate dielectric multilayer of the memory cells.

In accordance with the present invention, formation of the intermediate dielectric multilayer of the memory cells and the gate dielectric of the transistor calls for, after formation of the floating gate with a gate oxide layer and a polycrystalline silicon layer, and after formation of the lower dielectric material layer, the following process steps:

removal from the matrix peripheral zones of the above mentioned layers;

deposition of said upper silicon oxide layer over the memory cells and over the substrate in the area in which the peripheral transistors are formed; and formation of a first silicon oxide layer at least in the peripheral transistor areas.

In accordance with one embodiment of the present invention, formation of the first silicon oxide layer takes place by means of a high-temperature treatment in an oxidizing ambient. The gate dielectric layer is therefore composed of an underlying silicon oxide layer achieved by means of thermal treatment and an overlying silicon oxide layer deposited and densified by the above mentioned thermal treatment.

To provide an added second transistor type having gate dielectric of a second thickness. thinner than the first thickness of the first transistor type, successive steps are performed in accordance with the present invention.

The gate dielectrics formed can be advantageously nitridized at the end of their formation if desired.

The present invention solves the problems of the prior art by utilizing a process for the formation of an integrated circuit comprising non-volatile memory cells and peripheral transistors of the type described above and defined in the accompanying claims.

The present invention also solves the problem of the prior art by an integrated circuit comprising non-volatile memory cells and peripheral MOS transistors of at least one type.

The advantages of the formation process in accordance with the present invention are set forth in the Detailed Description of embodiments thereof given below by way of non-limiting example with reference to the annexed drawings.

BRIEF DESCRIPTION OF THE DRAWINGS

In the Drawings

The invention will be better understood and appreciated from the following detailed description of illustrative embodiments thereof, and the accompanying drawings in which:

FIGS. 1a–1c show diagrammatic cross section views of successive steps of a process in accordance with the present invention for the formation of non-volatile memory cells and peripheral transistors of a first type, and FIGS. 2a–2e are diagrammatic cross section views of corresponding process steps in which another type of peripheral transistor is formed simultaneously.

DETAILED DESCRIPTION

The description of a formation process for memory cells and peripheral transistors in accordance with the present invention is given below with particular reference to one preferred embodiment as shown in FIGS. 1a–1c. These figures show unscaled diagrammatic cross section views and illustrate in successive steps a formation process for a non-volatile memory cell and a peripheral MOS transistor of a first type. The partial structures of the cell and the transistor are indicated respectively by reference numbers 1 and 2. The regions R1 and R2 represent the zones in which the cell 1 and the transistor 2 are formed. There are shown in detail only the more significant process steps of the present invention, regarding the formation of the intermediate dielectric of the cell and the gate dielectric of the transistor.

The diagrams shown refer to the instance in which the intermediate dielectric of the memory cell consists of a triple layer comprising silicon oxide, silicon nitride and silicon oxide in succession.

The diagrammatic structure of the memory cell 1 is consistent with that of any non-volatile memory cell whether EPROM, EEPROM or FLASH, and consists of a floating gate MOS transistor. The peripheral transistor 2 is also the MOS type in accordance with the present invention. The process to which reference is made in the following description of this embodiment is a MOS type process, preferably performed with CMOS technology.

The initial steps of a process of formation of memory cells and peripheral transistors, not shown in the figures because it is conventional, comprise defining insulation regions on a substrate 3 of semiconductor material, usually monocrystalline silicon, where a thick silicon oxide, so-called field oxide, is formed and which delimits active area regions. It is noted that the cross sections shown in the figures are contained entirely in active area regions and therefore the field oxide is not visible.

Successively, both in active area regions in which the memory cells will be formed and in external regions in which the peripheral transistors will be formed, and in particular in regions R1 and R2 of the figures, silicon oxide, indicated by 4 in the figures, is grown by means of high-temperature thermal oxidation of the substrate. The layer 4 represents the so-called gate oxide of the memory cells. The gate oxide layer of the cells is thin to allow transfer of the charge between the substrate and the floating gate by means of known physical mechanisms. The mechanism used depends on the type of non-volatile memory used. The gate oxide layer's thickness can vary between 70 Å and 250 Å, depending on the type of non-volatile memory cells and the associated programming and erasure mechanism.

Over this gate oxide layer 4 of the cells is formed a first layer of electroconductive material, indicated in FIG. 1a by 5 and which will constitute the floating gate of the cell 1. The layer 5 consists commonly of a first polycrystalline silicon layer, known briefly as poly 1, and is usually deposited over the entire silicon chip on which the integrated circuit is formed.

The process continues with formation of the lower part of the intermediate dielectric layer of the memory cells. Preferably a silicon oxide layer 6 is formed alternatively by Chemical Vapor Deposition (CVD) or by means of high-temperature oxidation of the polysilicon layer 5. In addition a silicon nitride layer 7 is deposited by the CVD technique. The two layers 6 and 7 shown in the figures represent as a whole the lower dielectric layer 8 which is part of the intermediate dielectric. However, the case where the lower layer 8 is entirely made up of a single silicon oxide layer, i.e. without overlaying thereon a silicon nitride layer, falls within the scope of the present invention.

Some steps allow partial definition of the final cell structure, by means of removal in some zones of one or more layers from among those described above. These steps are specific for each different non-volatile memory type, and are not described here for the sake of simplicity.

In accordance with this embodiment of the present invention, before formation of the upper part of the intermediate dielectric of the cells, the lower layer 8 of the intermediate dielectric, the polysilicon layer 5 and the gate oxide layer 4 of the cell 1 are removed in succession from the active peripheral areas, i.e. the region R2 in which the peripheral transistor is to be formed. Removal takes place by means of a photolithographic technique of masking and successive chemical etching, at the end of which the mask of photosensitive material, usually a resin, is removed. FIG. 1a shows the structure of the memory cell 1 and the region R2 assigned to the transistor 2 after performing this process step.

Advantageously, removal of the mask used for the preceding etching is followed by a step of cleaning of the entire chip surface, preferably by means of acid etching, e.g., in hydrofluoric acid (HF). This step has the purpose of eliminating any possible residues of the mask which, being of organic material, introduces impurities, especially on the exposed surface of the substrate in the peripheral region R2. The cleaning can be done advantageously if the lower intermediate dielectric layer 8 includes the silicon nitride layer 7 as in the present embodiment. In this case the exposed cell surface, which is silicon nitride, is not damaged by an etching of the specified type.

The intermediate dielectric of the cells is completed by formation by deposition of a silicon oxide layer 9 shown in FIG. 1b. The deposition can take place by means of any of the chemical vapor deposition techniques and preferably by means of a High Temperature Oxidation (HTO) technique, i.e., by means of any of the high-temperature CVD techniques. The chemical used is chosen from conventional ones, e.g., tetraethylorthosilicate which is known to those skilled in the art as TEOS. The thickness of this deposited silicon oxide layer 9 is preferably between 50 Å and 250 Å. Its thickness depends on that of the intermediate dielectric layer 8.

As shown in FIG. 1b, the layer 9 is deposited not only in the region R1 of the memory cell matrix but also in the peripheral region R2 in which it constitutes the upper part of the gate dielectric of the peripheral transistor 2.

A silicon oxide layer is formed successively at least in the area R2 of the peripheral transistor. Preferably this step comprises an operation of high-temperature oxidation of the substrate in an oxidizing ambient. The oxidation increases the gate dielectric thickness of the transistor 2 to form a silicon oxide layer between the substrate and the deposited oxide layer 9. This silicon oxide layer is the so-called thermal type because achieved by means of a thermodynamic process of raising the temperature and is indicated in FIG. 1c by 10. This oxidation advantageously permits densification of the deposited silicon oxide layer 9.

The high-temperature treatment is preferably performed in an oxidizing ambient in an atmosphere containing oxygen ($O_2$) and/or steam ($H_2O$) and at a temperature between 750° C. and 950° C.

Formation of the intermediate dielectric multilayer of the cell 1 and the gate dielectric of the transistor 2 in accordance with one embodiment of the present invention is completed by a nitridizing process performed by means of annealing in an ambient containing $N_2O$ to further increase reliability of the gate dielectric of the transistor 2.

The gate dielectric of the transistor 2 therefore comprises, in this illustrative embodiment of the present invention, an underlying thermal silicon oxide layer 10 and an overlying deposited silicon oxide layer 9. The latter appears as an extension of the upper silicon oxide layer of the intermediate dielectric multilayer of the cell 1.

The process in accordance with this embodiment of the present invention can be also used where it is necessary to integrate in the same memory circuit peripheral transistors of at least two different types. In some applications, for example. both high-voltage and low-voltage transistors must be implemented. In this case it is the dielectric thickness which characterizes the transistor type, as gate dielectric thickness is greater in high-voltage transistors than in low-voltage transistors. In the present invention we refer more generally to transistors having gate dielectrics with different thicknesses.

A second embodiment of the present invention in which at least two transistor types having respective gate dielectrics of different thicknesses are formed simultaneously, is illustrated in FIGS. 2a–2e. In these figures, for structurally and functionally equivalent elements, the same reference numbers as for FIGS. 1a–1c are used.

The formation process in this second embodiment provides for the formation of a memory cell 1, a first peripheral transistor which is indicated by reference number 2' having a gate dielectric of a first thickness, and a second peripheral transistor 11 having a gate dielectric of a second thickness, respectively in the regions R1, R2 and R3.

The initial process steps are shown in FIGS. 2a–2c. These steps are similar to those described above in the corresponding FIGS. 1a–1c regarding the formation of cell 1 and transistor 2, and therefore are not further discussed. It should also be remembered that in this second embodiment the same process steps in the region R2 of the first transistor 2' are also performed in the region R3 where the second transistor 11 is to be formed.

In accordance with this second illustrative embodiment of the present invention, there is performed a step of masking the regions R1 and R2, of cell 1 and the first transistor 2', to allow removal by means of a photolithographic technique and successive chemical etching of the deposited silicon oxide layer 9 and of the underlying deposited silicon oxide 10 from the region R3 assigned to formation of the second transistor 11. FIG. 2d shows the three regions as they appear after removal of the mask.

An additional silicon oxide layer is formed in the active areas both of the first transistor 2' and of the second transistor 11. The formation is performed in particular by means of an oxidation operation with a high-temperature treatment in oxidizing ambient to induce oxidation of the substrate surface. The silicon oxide layer achieved in this step is indicated by 12 in FIG. 2e.

Preferably, growth of the additional silicon oxide layer 12 takes place by using parameters similar to those chosen above for formation of the silicon oxide layer 10. Therefore this step is performed preferably in an oxidizing ambient at a temperature between 750° C. and 950° C. and in an atmosphere containing at least one of the following gasses: oxygen ($O_2$) and steam ($H_2O$).

As shown in FIG. 2e, the gate dielectric of the first transistor 2' comprises a triple silicon oxide layer in which the two underlying layers 12 and 10 are, in accordance with the preferred technique, thermal oxides and the overlying layer 9 is deposited oxide. The gate dielectric of the second transistor 11 includes only one thermal silicon oxide layer 12 which is formed last. In FIG. 2e the line of demarcation between the thermal oxide layers 12 and 10 is shown as a broken line since after oxidation of the two layers. which have the same composition and formation, the two layers are indistinguishable.

Before the second oxidation to form the layer 12 and after elimination of the mask permitting removal of the silicon oxide layers from the regions of the second transistor 11, it is also possible to perform an optional cleaning step with partial surface removal of the deposited silicon oxide layer 9 from the areas of the cell 1 and of the first transistor 2' which were exposed to contamination of the above mentioned mask. In this manner the surface of the layer 9, whose deposition parameters, along with the growth parameters of the layer 10 must be appropriately and previously chosen in order to achieve the desired thickness, is adequately cleaned.

After growth of the last thermal silicon oxide layer 12 formation of the gate dielectrics of the first and second peripheral transistors 2' and 11 is completed. The final oxidation can be followed, if desired, by a nitridizing operation to improve the quality of the oxides already formed.

In accordance with the illustrated embodiments of the present invention the overall thicknesses of the gate oxides of both types of transistors described are between 70 Å and 350 Å. The thermal oxide thicknesses also fall within this range.

With reference to both described illustrative embodiments in accordance with the present invention, after the above described formation of the intermediate dielectric multilayer of the cell and the gate dielectric of one or both of the peripheral transistors, completion of the cell and the transistors takes place through standard process steps. In particular a second polysilicon layer, or poly 2, and if desired a silicide layer are deposited and then patterned for simultaneous formation of the control gate of the cell and of the gate of the transistors. The process is completed by appropriate implantations, formation of a passivation layer, and of the circuit interconnections by means of opening of contacts, and deposition of one or more metal layers.

Therefore, in the process in accordance with the present invention the gate dielectric at least of the first type of transistor is not formed after the formation of the intermediate dielectric of the cells. Deposition of the last silicon oxide layer of the intermediate dielectric permits simultaneous formation of the gate dielectric upper layer of the first type of transistor. Advantageously, in accordance with the present invention, in the first type of peripheral transistors, respectively 2 in FIGS. 1a–1c and 2' in FIGS. 2a–2e, the underlying thermal oxide layer 10, and if required also the layer 12, is formed after the overlying deposited oxide layer 9 is formed. This permits formation of the thermal oxide layer 10 and simultaneous densification, as mentioned above, of the layer 9 without further steps such as thermodynamic annealing processes which are essential in the prior art for curing the deposited layer and to ensure operation of the device.

The present invention, in which the deposited silicon oxide layer is densified in at least one successive oxidation step, thus provides gate dielectrics with better quality both in terms of defects and in terms of electrical qualities.

The use of a double layer for formation of the gate dielectric of the first transistor type whose upper part is deposited prevents formation of defects in the gate dielectric. Indeed, a defect in one of the layers is covered by the other layer and the simultaneous presence of two defects at exactly the same point in the layers is highly improbable.

Furthermore the upper layer being deposited conforms to the surface of the underlying structure, covering irregular oxide growth in critical positions, e.g., of the field oxide layer at its edges.

It should be remembered that the thermal oxide and the oxide deposited in accordance with the present invention are distinguishable by means of electrical, physical and optical measurements because they have different dielectric constants.

It is noted that the process in accordance with the present invention has the advantage of allowing formation of distinct layers of silicon oxide whose thicknesses can be chosen independently. In the illustrated embodiments in the above description in which the intermediate dielectric layer of the memory cells consists of a triple oxide-nitride-oxide layer, the only fixed value for formation of the layers making up the gate dielectric of the transistors is that of the deposited oxide layer 9. Its thicknesses should be determined, as known to those skilled in the art, on the basis of the relative thickness of the other two layers contained in the intermediate dielectric of the memory to ensure good operation thereof.

The process in accordance with the present invention is particularly simple and its embodiment does not present manufacturing difficulties.

Another advantage of the described process is the flexibility in particular in the use of optional cleaning steps described above, for optimization of the functionality of the dielectrics.

It should be remembered that although a process for manufacturing a memory cell with triple interpoly dielectric layer is described, the present invention is also applicable to intermediate dielectrics containing only silicon oxide.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for forming an integrated circuit in a monocrystalline silicon substrate having implemented therein at least one matrix of non-volatile memory cells each having a floating gate and a control gate, each floating and control gate being electroconductive and electrically insulated from each other by means of an intermediate dielectric multilayer including a lower dielectric material layer and an upper silicon oxide layer, and the substrate also having simultaneous implementation in an area peripheral to the matrix of memory cells of at least a first transistor having a first gate dielectric of a first thickness, the process comprising the steps of:

(A) forming a gate oxide layer, a polycrystalline silicon layer that forms the floating gate, and the lower dielectric material layer;

(B) removal of the gate oxide layer, the polycrystalline layer, and the lower dielectric material layer from the area including the at least a first transistor;

(C) deposition of the upper silicon oxide layer over the floating gate and over the substrate in the area including the at least first transistor; and (D) formation of a first silicon oxide layer in the area including the at least a first transistor, wherein step (D) comprises oxidation by high-temperature treatment of the substrate in the area including the first transistor in an oxidizing ambient allowing growth of the first silicon oxide layer between the upper silicon oxide layer and the substrate.

2. The process in accordance with claim 1, wherein the oxidizing ambient is at a temperature between 750° C. and 950° C. and in an atmosphere containing at least one of the following compounds: $O_2$ and $H_2O$.

3. The process in accordance with claim 1, further comprising a step of high-temperature nitridizing said first silicon oxide layer.

4. A process for forming an integrated circuit in a monocrystalline silicon substrate having implemented therein at least one matrix of non-volatile memory cells each having a floating gate and a control gate, each floating and control gate being electroconductive and electrically insulated from each other by means of an intermediate dielectric multilayer including a lower dielectric material layer and an upper silicon oxide layer, and the substrate also having simultaneous implementation in an area peripheral to the matrix of memory cells of a first transistor having a first gate dielectric of a first thickness and a second transistor having a second gate dielectric of a second thickness, thinner than said first thickness, the process comprising the steps of:

(A) forming a gate oxide layer, a polycrystalline silicon layer that forms the floating gate, and the lower dielectric material layer;

(B) removal of the gate oxide layer, the polycrystalline layer, and the lower dielectric material layer from the area including the first and second transistors;

(C) deposition of the upper silicon oxide layer over the floating gate and over the substrate in the area including the first and second transistors;

(D) formation of a first silicon oxide layer in the area including the first and second transistors;

(E) removal of the upper silicon oxide layer and said first silicon oxide layer from the area including said second transistor; and (F) formation of a second silicon oxide layer in both the area including the first transistor and the area including the second transistor.

5. The process in accordance with claim 4, wherein step (F) includes oxidation with a high-temperature treatment of the substrate in oxidizing ambient.

6. The process in accordance with claim 5, wherein the oxidizing ambient is at a temperature between 750° C. and 950° C. and an atmosphere containing at least one of the following compounds: $O_2$ and $H_2O$.

7. The process in accordance with claim 4, further comprising the step of high-temperature nitridizing said second silicon oxide layer.

8. The process in accordance with claim 4, further comprising the step of partial surface removal of the upper silicon oxide layer from the area of the substrate including the first transistor and from the area of the substrate including the memory cells after performing step (E).

9. The process in accordance with claim 1, wherein the process is implemented in CMOS technology.

10. The process in accordance with claim 1, wherein a thickness of said upper silicon oxide layer is between 50 Å and 250 Å.

11. The process in accordance with claim 4, wherein a thickness of said upper silicon oxide layer is between 50 Å and 250 Å and said first thickness and said second thickness are between 70 Å and 350 Å.

12. A method of fabricating an integrated circuit formed on a substrate, the integrated circuit including a memory cell, a first transistor and a second transistor, the memory cell including a floating gate, a control gate, and a multilayer dielectric for insulating the floating gate from the control gate, the first transistor including a first multilayer gate dielectric having a first thickness, and the second transistor including a second multilayer gate dielectric having a second thickness, the method comprising the steps of:

(A) removal of the multilayer dielectric and the floating gate of the memory cell from an area on the substrate in which the first and second transistors are formed, the area being peripheral to an area in which the memory cell is formed;

(B) depositing a first silicon oxide layer over the areas on the substrate in which the memory cell and the first and second transistors are formed;

(C) forming a second silicon oxide layer in the area of the substrate in which the first and second transistors are formed;

(D) removing the multilayer dielectric and the floating gate of the memory cell from an area on the substrate in which the second transistor is formed;

(E) removing the first silicon oxide layer and the second silicon oxide layer from the area in which the second transistor is formed; and (F) forming a third silicon oxide layer in the areas in which the first and second transistors are formed.

13. The process of claim 12, wherein step (C) includes high temperature oxidation of the area.

14. The process of claim 12, wherein step (C) includes high temperature oxidation of the area in which the first transistor is formed and step (F) includes high temperature oxidation of the areas in which the first and second transistors are formed.

* * * * *